US009256491B1

(12) United States Patent
Dropps

(10) Patent No.: US 9,256,491 B1
(45) Date of Patent: Feb. 9, 2016

(54) METHOD AND SYSTEM FOR DATA INTEGRITY

(71) Applicant: QLOGIC, Corporation, Aliso Viejo, CA (US)

(72) Inventor: Frank R. Dropps, Maple Grove, MN (US)

(73) Assignee: QLOGIC, Corporation, Aliso Viejo, CA (US)

( * ) Notice: Subject to any disclaimer, the term of this patent is extended or adjusted under 35 U.S.C. 154(b) by 67 days.

(21) Appl. No.: 14/034,006

(22) Filed: Sep. 23, 2013

(51) Int. Cl.
*H03M 13/00* (2006.01)
*G06F 11/10* (2006.01)
*H03M 13/09* (2006.01)

(52) U.S. Cl.
CPC ............ *G06F 11/10* (2013.01); *H03M 13/093* (2013.01)

(58) Field of Classification Search
None
See application file for complete search history.

(56) References Cited

U.S. PATENT DOCUMENTS

| 5,544,180 | A  | * | 8/1996  | Gupta ............................ 714/798 |
| 5,777,986 | A  | * | 7/1998  | Grossman ..................... 370/235 |
| 6,434,114 | B1 | * | 8/2002  | Jain et al. ...................... 370/230 |
| 6,477,669 | B1 | * | 11/2002 | Agarwal et al. ............... 714/708 |
| 7,219,255 | B2 | * | 5/2007  | Khalil et al. ................... 714/4.2 |
| 7,681,102 | B2 | * | 3/2010  | Sonksen et al. ............... 714/752 |
| 2005/0278388 | A1 | * | 12/2005 | Butterworth et al. ......... 707/200 |
| 2009/0309770 | A1 | * | 12/2009 | Andreev et al. ................. 341/81 |
| 2011/0161559 | A1 | * | 6/2011  | Yurzola et al. ................ 711/103 |
| 2014/0321298 | A1 | * | 10/2014 | Chow et al. ................... 370/252 |

* cited by examiner

*Primary Examiner* — Daniel McMahon
(74) *Attorney, Agent, or Firm* — Klein, O'Neill & Singh, LLP

(57) ABSTRACT

A device having a storage location for receiving an original data and a corresponding original error correction code (ECC) is provided. The device includes ECC modification pattern generator logic for comparing modified data and the original data for generating a pattern for modifying the original ECC and ECC modification logic for modifying the original ECC based on the pattern.

20 Claims, 5 Drawing Sheets

US 9,256,491 B1

METHOD AND SYSTEM FOR DATA INTEGRITY

BACKGROUND

1. Technical Field

The embodiments disclosed herein are related to data integrity in computing devices and more particularly, in networking devices.

2. Related Art

Network devices are commonly used to move network information (which may also be referred to interchangeably, as frames, packets, data or commands) between computing systems (for example, servers) or between computing systems and network devices (for example, storage systems). Various hardware and software components are used to implement network communication. Network devices for example, switches, adapters and others typically communicate using ports that have logic and circuitry for sending and receiving information. The ports typically use receive buffers (or memory storage devices) for receiving and temporarily storing information (for example, frames, packets and other information), before information is sent to an appropriate destination.

Physical size of computing devices and the memory structures used by such devices continue to shrink making them susceptible to single event based errors. As data moves within a device, it ought to be protected at every domain. One way to detect and correct errors is by using error correcting code (ECC). ECC is typically used by data storage and transmission devices. When data is written to a storage location, ECC is computed and stored alongside the data. When the data is read back, the ECC is typically recomputed and compared against ECC stored at the storage location. Any discrepancy is an indication of bit errors in the stored data. By examining the discrepancies between the ECCs, errors can be detected and fixed. Typically, an ECC algorithm is applied to a fixed number of data bits, for example, 32, 64, 128, 256, 512 or 1024 bits. Hamming code and BCH are two examples of using ECC.

Protecting data in multiple domains results in complex circuitry, may increase latency in moving data and may reduce performance of a device to move and/or process information. Continuous efforts are being made to improve data integrity in network and computing devices.

BRIEF DESCRIPTION OF THE DRAWINGS

The various present embodiments now will be discussed in detail with an emphasis on highlighting the advantageous features. These embodiments depict the novel and non-obvious systems and methods for network devices shown in the accompanying drawings, which are for illustrative purposes only. These drawings include the following figures, in which like numerals indicate like parts.

DETAILED DESCRIPTION

Figure 1:
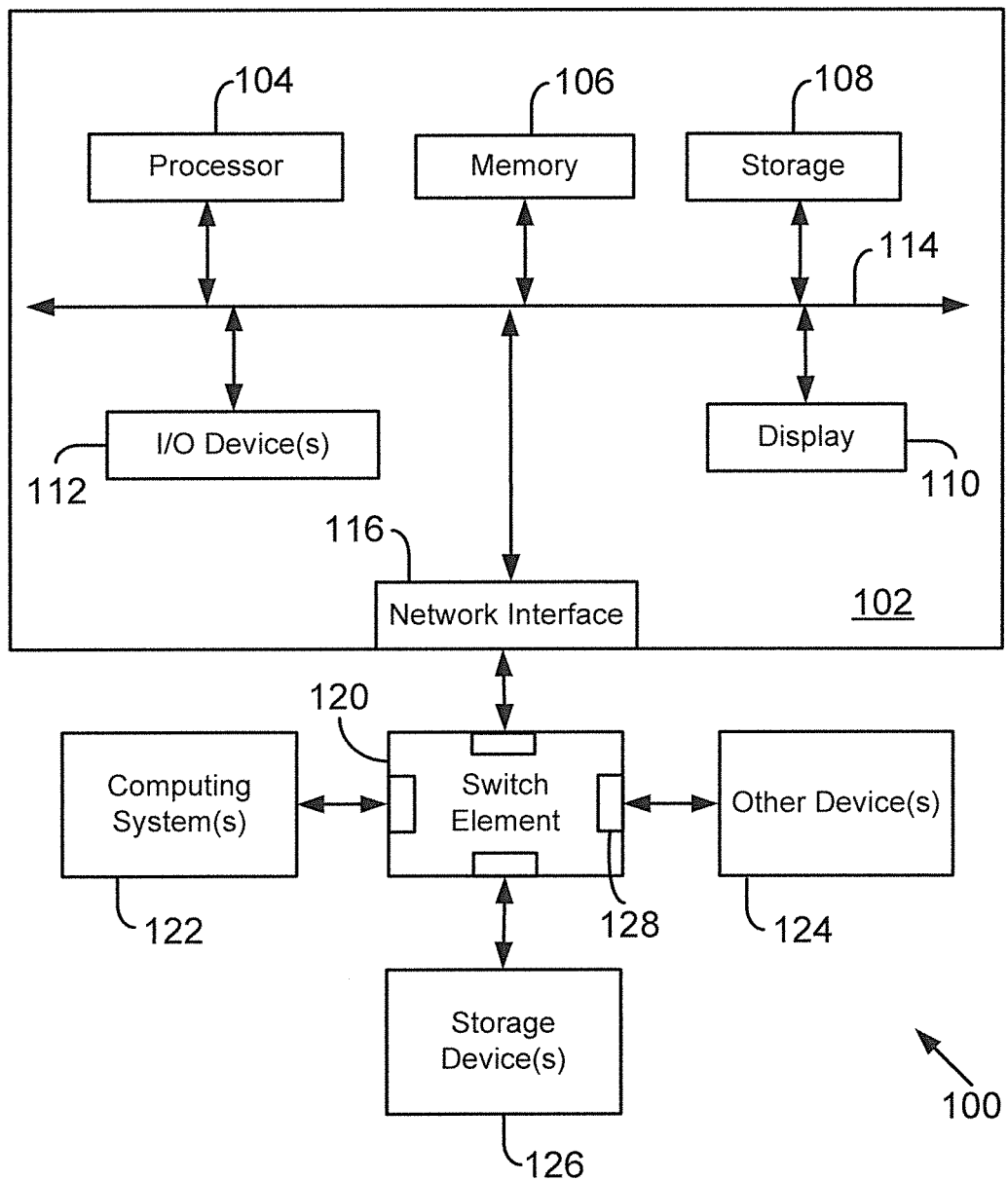
FIG. 1 shows an example of a system using the present embodiments.

The following detailed description describes the present embodiments with reference to the drawings. In the drawings, reference numbers label elements of the present embodiments. These reference numbers are reproduced below in connection with the discussion of the corresponding drawing features.

As a preliminary note, any of the embodiments described with reference to the figures may be implemented using software, firmware, hardware (e.g., fixed logic circuitry), manual processing, or a combination of these implementations. The terms "logic," "module," "component," "system" and "functionality," as used herein, generally represent software, firmware, hardware, or a combination of these elements. For instance, in the case of a software implementation, the terms "logic," "module," "component," "system," and "functionality" represent program code that performs specified tasks when executed on a processing device or devices (e.g., CPU or CPUs). The program code can be stored in one or more computer readable memory devices.

More generally, the illustrated separation of logic, modules, components, systems, and functionality into distinct units may reflect an actual physical grouping and allocation of software, firmware, and/or hardware, or can correspond to a conceptual allocation of different tasks performed by a single software program, firmware program, and/or hardware unit. The illustrated logic, modules, components, systems, and functionality may be located at a single site (e.g., as implemented by a processing device), or may be distributed over a plurality of locations.

The term "machine-readable media" and the like refers to any kind of non-transitory medium for retaining information in any form, including various kinds of storage devices (magnetic, optical, static, etc.). Machine-readable media also encompasses transitory forms for representing information, including various hardwired and/or wireless links for transmitting the information from one point to another.

The embodiments disclosed herein, may be implemented as a computer process (method), a computing system, or as an article of manufacture, such as a computer program product or computer-readable media. The computer program product may be computer storage media, readable by a computer device, and encoding a computer program of instructions for executing a computer process. The computer program product may also be a propagated signal on a carrier, readable by a computing system, and encoding a computer program of instructions for executing a computer process.

Various network standards and protocols may be used to enable network communications using the disclosed embodiments, including Fibre Channel (FC), Fibre Channel over Ethernet (FCoE), Ethernet, and others. Below is a brief introduction to some of these standards. The present embodiments are described herein with reference to the Fibre Channel, FCoE and Ethernet protocols. However, these protocols are used merely for ease of reference and to provide examples. The present embodiments are not limited to Fibre Channel, FCoE and Ethernet.

Fibre Channel (FC) is a set of American National Standards Institute (ANSI) standards. Fibre Channel provides a serial transmission protocol for storage and network protocols such as HIPPI, SCSI, IP, ATM and others. Fibre Channel provides an input/output interface to meet the requirements of both channel and network users. The Fibre Channel standards are incorporated herein by reference in their entirety.

Fibre Channel supports three different topologies: point-to-point, arbitrated loop and Fibre Channel Fabric. The point-to-point topology attaches two devices directly. The arbitrated loop topology attaches devices in a loop. The Fabric topology attaches computing systems directly to a Fabric, which are then connected to multiple devices. The Fibre Channel Fabric topology allows several media types to be interconnected.

A Fibre Channel switch is a multi-port device where each port manages a point-to-point connection between itself and its attached system. Each port can be attached to a server, peripheral, I/O subsystem, bridge, hub, router, or even another switch. A switch receives messages from one port and routes them to other ports. Fibre Channel switches use memory buffers to hold frames received and sent across a network. Associated with these buffers are credits, which are the number of frames that a buffer can hold per Fabric port.

Ethernet is a family of computer networking technologies for local area networks (LANs). Systems communicating over Ethernet divide a stream of data into individual frames (or packets). Each frame contains source and destination addresses and error-checking data so that damaged data can be detected and re-transmitted. Ethernet is standardized in IEEE 802.3, which is incorporated herein by reference in its entirety.

Fibre Channel over Ethernet (FCoE) is a converged network and storage protocol for handling both network and storage traffic. The FCoE standard enables network adapters and network switches to handle both network and storage traffic using network and storage protocols. Under FCoE, Fibre Channel frames are encapsulated in Ethernet frames. Encapsulation allows Fibre Channel to use Gigabit Ethernet networks (or higher speeds) while preserving the Fibre Channel protocol.

The systems and processes described below are applicable and useful in the upcoming cloud computing environments. Cloud computing pertains to computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. The term "cloud" is intended to refer to the Internet and cloud computing allows shared resources, for example, software and information, to be available, on-demand, like a public utility.

Typical cloud computing providers deliver common business applications online, which are accessed from another web service or software like a web browser, while the software and data are stored remotely on servers. The cloud computing architecture uses a layered approach for providing application services. A first layer is an application layer that is executed at client computers. In this example, the application allows a client to access storage via a cloud. After the application layer is a cloud platform and cloud infrastructure, followed by a "server" layer that includes hardware and computer software designed for cloud-specific services.

FIG. 1 shows an example of a system 100 that may be used in connection with the present embodiments. System 100 may include a computing system 102, which may be referred to as a host system. A typical host system 102 includes several functional components, including a central processing unit (CPU) (also referred to as a processor/processors or processing module) 104, a host memory (or main/system memory) 106, a storage device 108, a display 110, input/output ("I/O") device(s) 112, and other components (or devices). The host memory 106 is coupled to the processor 104 via a system bus or a local memory bus 114. The processor 104 may be, or may include, one or more programmable general-purpose or special-purpose microprocessors, digital signal processors (DSPs), programmable controllers, application specific integrated circuits (ASICs), programmable logic devices (PLDs), or the like, or a combination of such hardware-based devices.

The host memory 106 provides the processor 104 access to data and program information that is stored in the host memory 106 at execution time. Typically, the host memory 106 includes random access memory (RAM) circuits, read-only memory (ROM), flash memory, or the like, or a combination of such devices.

The storage device 108 may comprise one or more internal and/or external mass storage devices, which may be or may include any conventional medium for storing large volumes of data in a non-volatile manner. For example, the storage device 108 may include conventional magnetic disks, optical disks such as CD-ROM or DVD-based storage, magneto-optical (MO) storage, flash-based storage devices, or any other type of non-volatile storage devices suitable for storing structured or unstructured data.

The host system 102 may also include a display device 110 capable of displaying output, such as an LCD or LED screen and others, and one or more input/output (I/O) devices 112, for example, a keyboard, mouse and others. The host system 102 may also include other devices/interfaces for performing various functions, details of which are not germane to the inventive embodiments described herein.

The host system 102 also includes a network interface 116 for communicating with other computing systems 122, storage devices 126, and other devices 124 via a switch element 120 and various links. The network interface 116 may comprise a network interface card (NIC) or any other device for facilitating communication between the host system 102, other computing systems 122, storage devices 126, and other devices 124. The network interface 116 may include a converged network adapter, a host bus adapter, a network interface card or any other network adapter type. The embodiments described herein may be implemented in network interface 116.

In one embodiment, the processor 104 of the host system 102 may execute various applications, for example, an e-mail server application, databases, and other application types. Data for various applications may be shared between the computing systems 122 and stored at the storage devices 126. Information may be sent via switch 120 ports 128. The term port as used herein includes logic and circuitry for receiving, processing, and transmitting information.

Each device (e.g. the host system 102, the computing systems 122, the storage devices 126, and the other devices 124) may include one or more ports for receiving and transmitting information, for example, node ports (N_Ports), Fabric ports (F_Ports), and expansion ports (E_Ports). Node ports may be located in a node device, e.g. network interface 116 the host system 102 and an interface (not shown) for the storage devices 126. Fabric ports are typically located in Fabric devices, such as a network switch element, for example, switch element 120.

Figure 2:
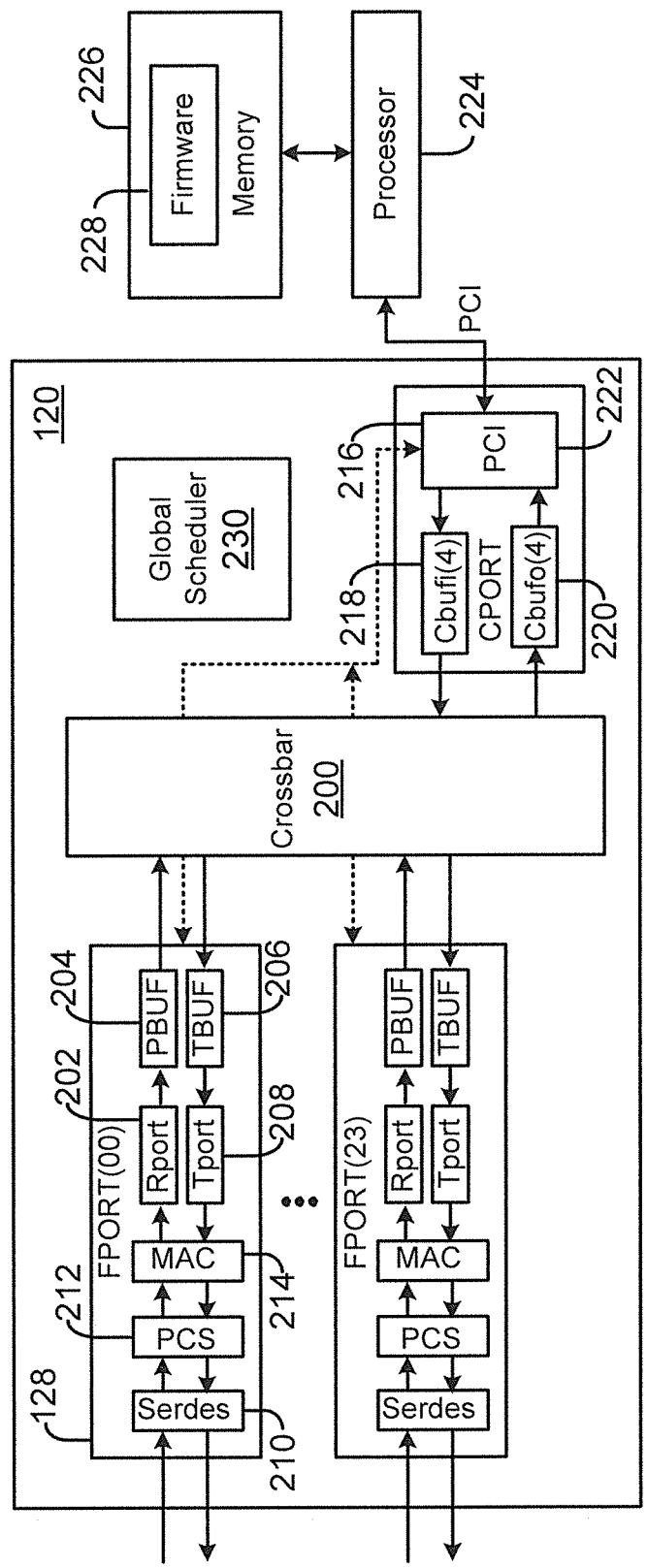
FIG. 2 shows an example of a switch element used in the system of FIG. 1.

FIG. 2 is a high-level block diagram of switch element 120, also referred to as the switch 120. It is noteworthy that the embodiments disclosed herein are not limited to switch element 120 and may be implemented and practiced in other network device type, for example, adapter, NICs and other device types.

Switch element 120 may be implemented as an application specific integrated circuit (ASIC) having a plurality of ports 128. Frames are received at ports 128 and a global scheduler 230 (also referred to as scheduler 230) then schedules frame processing/transmission for all ports 128.

Ports 128 are generic (GL) ports and may include an N_Port, F_Port, FL_Port, E-Port, or any other port type. Ports 128 may be configured to operate as Fibre Channel, FCoE or Ethernet ports. In other words, depending upon what it is attached to, each GL port can function as any type of port. As an example, ports 128 of FIG. 2 are drawn on the same side of the switch element 120. However, ports 128 may be located on any or all sides of switch element 120. This does not imply any difference in port or ASIC design. The actual physical layout of the ports will depend on the physical layout of the ASIC.

Ports 128 communicate via a time shared crossbar 200, which includes a plurality of switch crossbars for handling specific types of data and data flow control information. For illustration purposes only, the switch crossbar 200 is shown as a single crossbar. The switch crossbar 200 may be a connectionless crossbar (packet switch) of conventional design, sized to connect a plurality of paths. This is to accommodate the ports 128 plus a port 216 for connection to a processor 224 that may be external to the switch element 120. In another embodiment, the processor 224 may be located within a switch chassis that houses the switch element 120.

Each port 128 receives incoming frames (or information) and processes the frames according to various protocol requirements. The port 128 includes a shared, time multiplexed pipeline for receiving frames (or information). The pipeline includes a serializer/deserializer (SERDES) 210, a physical coding sub-layer (PCS) 212, and a time multiplexed media access control (MAC) sub-layer 214. The SERDES 210 receives incoming serial data and converts it to parallel data. The parallel data is then sent to the PCS 212 and the MAC 214 before being sent to a receive segment (or receive port (RPORT) 202.

The RPORT (or receive segment) 202 temporarily stores received frames at a memory storage device, shown as PBUF (pause buffer) 204. The frames are then sent to a transmit segment (or transmit port (TPORT) 208 via the crossbar 200. The TPORT 208 includes a memory device shown as a transmit buffer (TBUF) 206. The TBUF 206 may be used to stage frames or information related to frames before they are transmitted. The TPORT 208 may also include a shared MAC and PCS or use the MAC and PCS of RPORT 202. The SERDES at TPORT is used to convert parallel data into a serial stream.

The switch element 120 may also include a control port (CPORT) 216 that communicates with the processor 224. The CPORT 216 may be used for controlling and programming the switch element 120. In one embodiment, the CPORT 216 may include a PCI (Peripheral Component Interconnect) 222 interface to enable the switch element 120 to communicate with the processor 224 and a memory 226. The processor 224 controls overall switch element operations, and the memory 226 may be used to store firmware instructions 228 for controlling switch element 120 operations.

The CPORT 216 includes an input buffer (CBUFI) 218, which is used to transmit frames from the processor 224 to the ports 128. The CPORT 216 further includes an output buffer (CBUFO) 220, which is used to send frames from the PBUFs 204, the TBUFs 206, and CBUFI 218 that are destined to processor 224.

Port 128 described above may be referred to as a "base-port" that may have more than one network link available for receiving and transmitting information. Each network link allows the base-port 128 to be configured into a plurality of independently, operating sub-ports, each uniquely identified for receiving and sending frames. The sub-port configuration may vary based on protocol and transfer rates. For example, port 128 may be configured to operate as four single lane Ethernet ports, three single lane Ethernet ports and one single lane Fibre Channel port, two single lane Ethernet ports and two single lane Fibre Channel ports, one single lane Ethernet port and three single lane Fibre Channel port, four single lane Fibre Channel port, two double lane Ethernet ports, 1 double lane Ethernet port and two single lane Ethernet ports, one double lane Ethernet port, one single lane Ethernet port and one single lane Fibre Channel port, one double lane Ethernet port and two single lane Fibre Channel port, one four lane Ethernet port or one four lane Fibre Channel port. Port 128 uses some logic that is shared among the multiple sub-ports and some logic that is dedicated to each sub-port.

Figure 3:
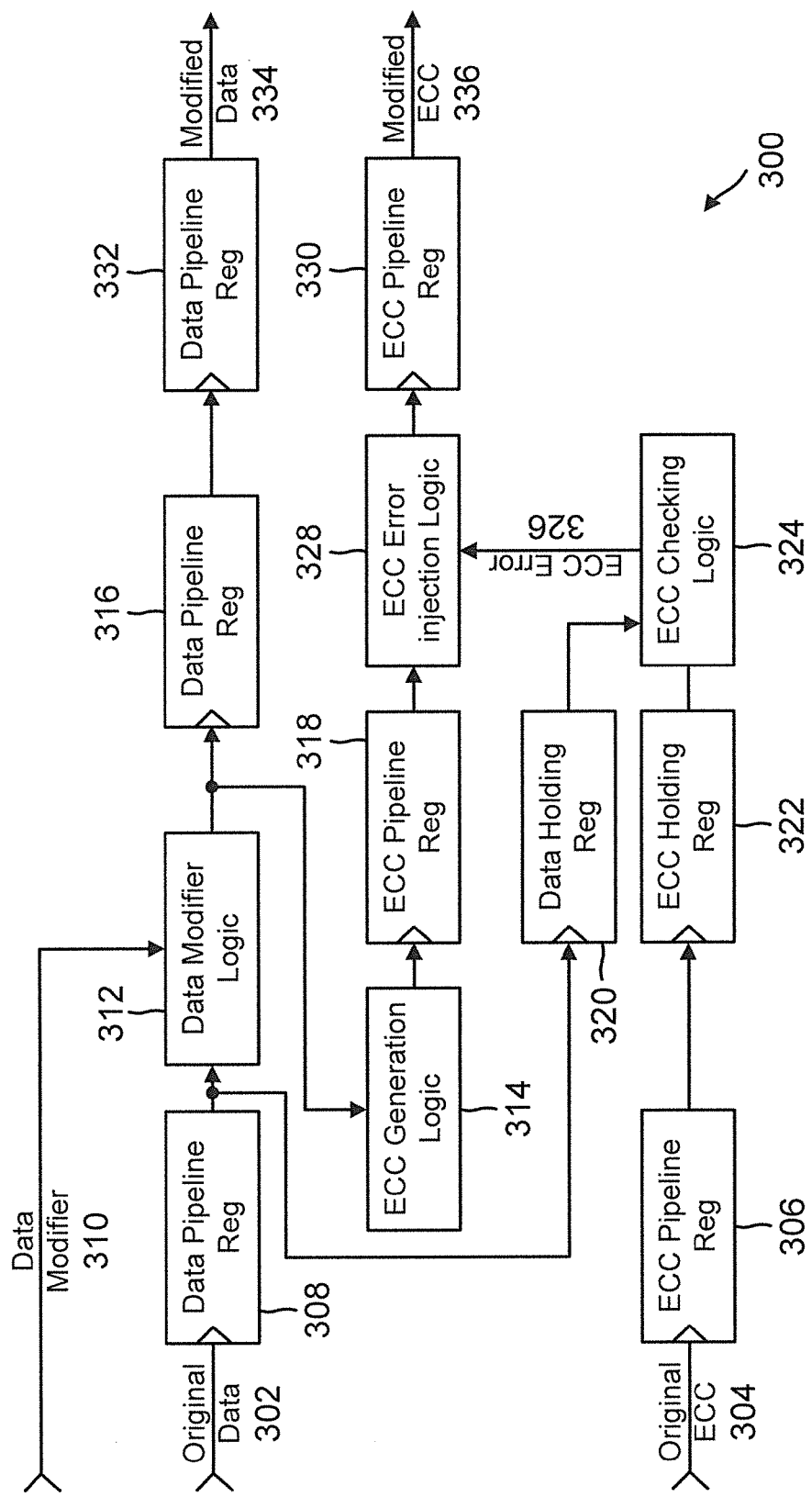
FIG. 3 is a functional block diagram showing a conventional system for ECC.

As packets or data move through a port or sub-port, they may be modified. ECC may be used to maintain data integrity as information moves from one location (i.e. protected domain) to another. FIG. 3 shows an example of a conventional system 300 for handling ECC and data modification within a data path. Original data 302 and its corresponding ECC 304 may be stored at data pipeline register 308 and ECC pipeline register 306. The registers may be located at any location within the port. When the original data 302 has to be modified, it is indicated by a data modifier 310. The data modification type may vary from one application to another and does not limit the embodiments disclosed herein.

The original data 302 is modified by data modification logic 312 depending on data modifier 310. These modifications may include destination address translations, source address translations, VLAN (virtual local area network) Tag translations, priority level modifications or any other changes to a packet header or payload. The modified data is then sent to ECC generation logic 314 that generates ECC for the modified data and stores the regenerated ECC at ECC pipeline register 318.

The original ECC is moved from register 306 to register 322 and the original data is moved from register 308 to 320. ECC checking logic 324 checks the ECC for the original data and if there are any errors 326, then the errors are provided to ECC error injection logic 328. The ECC error injection logic 328 injects the error in the regenerated ECC from logic 314. The regenerated logic with the injected error is moved to register 330. The modified data 334 moves from register 316 and 332 to its next location with the modified ECC 336.

As shown above, ECC for the modified data has to be regenerated; and errors in original data have to be injected for providing overlapping redundant protection domains. Thus system 200 uses complex logic and can become a performance bottleneck as additional pipeline stages are required that can add additional latency to processing network packets.

Figure 4:
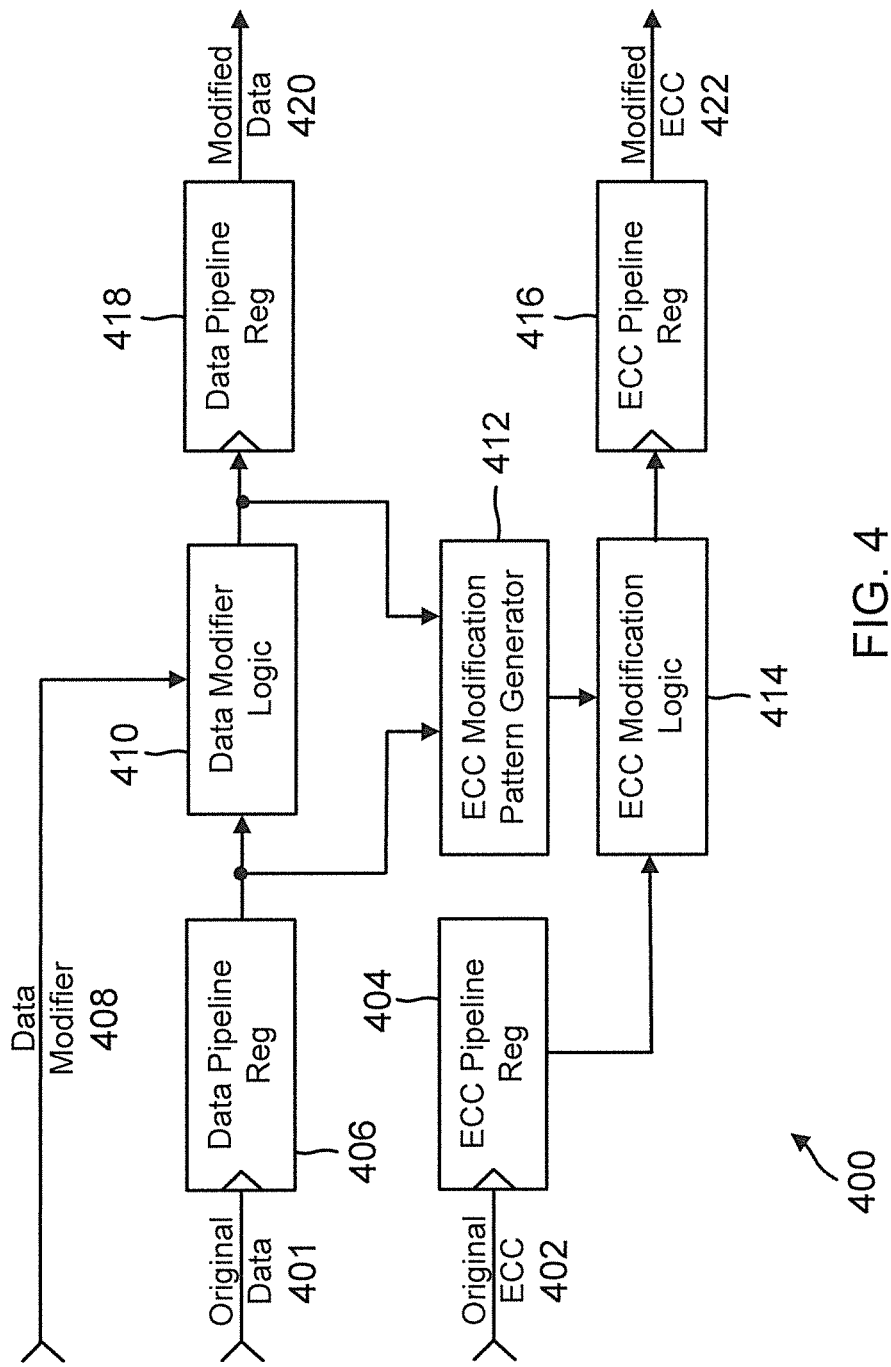
FIG. 4 is a functional block diagram of a ECC system, according to the present embodiments.

FIG. 4 shows an improved system 400 for providing overlapping protection for data, according to one embodiment. In system 400, original data 401 and original ECC 402 are stored at registers 406 and 404, respectively. Data modifier 408 indicates to data modification logic 410, as to what type of modification needs to be performed on original data 401. The data modification logic 410 modifies the data and places the modified data at register 418. The original data and the modified data are also provided to ECC modification pattern generator 412. The ECC modification pattern generator 412 compares the modified data and the original data and provides feedback to ECC modification logic 414 that also receives the original ECC from register 404. The output of the ECC modification pattern generator 412 is derived by taking an "Exclusive OR" between the unmodified data and the modified data. The next step in generating the ECC modification pattern generator 412 output is to perform standard ECC generation on the result from the "Exclusive OR" between the unmodified data and the modified data. This output may be the syndrome bits of the results from the "Exclusive OR" between the unmodified data and the modified data.

The modification logic 414 modifies the original ECC based on the comparison performed by ECC modification pattern generator 412. The modified ECC is derived by taking the "Exclusive OR" between the unmodified ECC syndrome bits and the output from the ECC modification pattern generator 412. The modified ECC is then placed at register 416. The modified data 420 and the modified ECC 422 are then sent to the next destination.

In one embodiment, system 400 does not have to regenerate the ECC for the modified data and instead modifies the original ECC based on a comparison of the original data and the modified data. As one can see, system 400 is simpler than system 300 described above with respect to FIG. 3.

Figure 5:
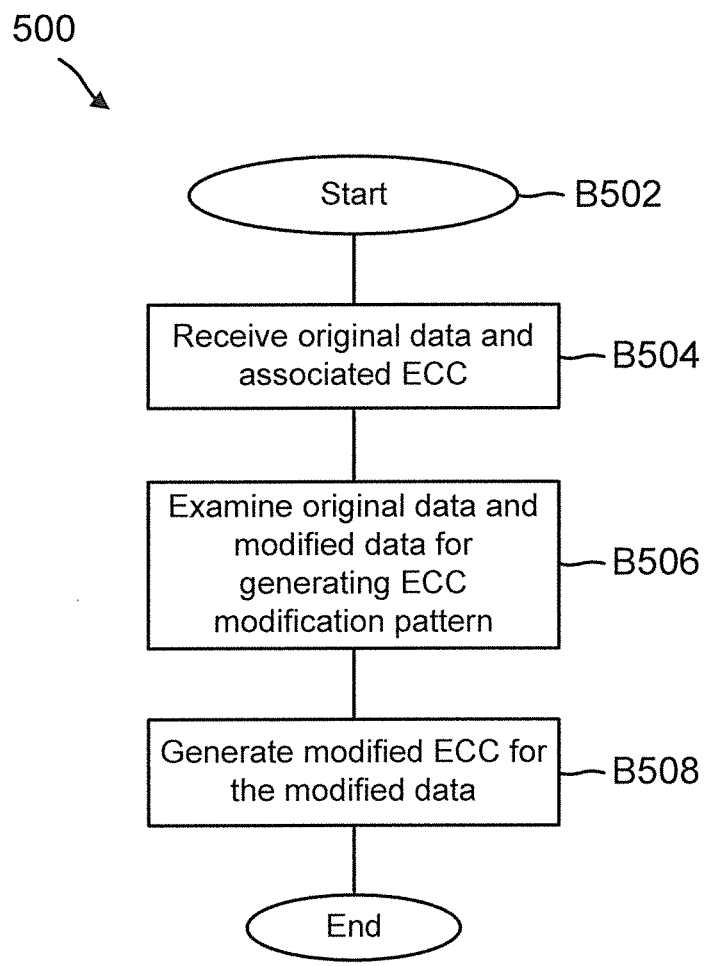
FIG. 5 shows a process flow diagram for using the system of FIG. 2, according to one embodiment.

FIG. 5 shows a process 500 for using system 400, according to one embodiment. The process begins in block B502. In block B504, original data 401 and ECC 402 are received and placed at registers 406 and 404, respectively. In block B506, ECC modification pattern generator 412 examines the original data 401 and the data modified by the data modifier logic 410. ECC modification pattern generator 412 then generates a modification pattern for ECC modification logic 414. Based on the pattern, in block B508, the original ECC 402 is modified for the modified data. Thereafter, the modified data 420 and the modified ECC 422 are sent to their next destination and the process ends.

It is noteworthy that system 400 may be implemented in any device where data integrity is needed, for example, switches, adapters, controllers and other devices.

The above description presents the best mode contemplated for carrying out the present invention, and of the manner and process of making and using it, in such full, clear, concise, and exact terms as to enable any person skilled in the art to which it pertains to make and use this invention. This invention is, however, susceptible to modifications and alternate constructions from that discussed above that are fully equivalent. For example, the foregoing embodiments may be implemented in adapters and other network devices. Consequently, this invention is not limited to the particular embodiments disclosed. On the contrary, this invention covers all modifications and alternate constructions coming within the spirit and scope of the invention as generally expressed by the following claims, which particularly point out and distinctly claim the subject matter of the invention.

What is claimed is:

1. A machine implemented method, comprising:
   a network device receiving original data and corresponding original error correction code (ECC) at a receive segment of a port of the network device;
   comparing modified data and the original data using an exclusive OR function for generating a pattern for modifying the original ECC; wherein the original data is modified by modifying a priority level of the original data and the generated pattern comprises syndrome bits derived from an output of the exclusive OR function; and
   modifying the original ECC based on the pattern to create a modified ECC, without having to regenerate the original ECC and transmitting the modified ECC with the modified data via a transmit segment of the port.

2. The method of claim 1, wherein the network device is a switch element having a plurality of ports.

3. The method of claim 2, wherein at least one of the plurality of ports of the switch element is configured to operate as a Fibre Channel port.

4. The method of claim 2, wherein at least one of the plurality of ports of the switch element is configured to operate as an Ethernet port.

5. The method of claim 2, wherein at least one of the plurality of ports of the switch element is configured to operate as a Fibre Channel over Ethernet port.

6. The method of claim 1, wherein the network device is an adapter.

7. The method of claim 1, wherein data modification logic modifies the original data based on a data modifier.

8. The method of claim 1, wherein ECC modification pattern generator logic compares the original data and the modified data.

9. A device, comprising:
   a network port with a receive segment for receiving an original data and a corresponding original error correction code (ECC);
   an ECC modification pattern generator logic for comparing modified data and the original data using an exclusive OR function for generating a pattern for modifying the original ECC; wherein the original data is modified by modifying a priority level of the original data and the generated pattern comprises syndrome bits derived from an output of the exclusive OR function; and
   an ECC modification logic for modifying the original ECC based on the pattern, without having to regenerate the original ECC.

10. The device of claim 9, wherein the device comprises a switch element having a plurality of ports.

11. The device of claim 10, wherein at least one of the plurality of ports of the switch element is configured to operate as a Fibre Channel port.

12. The device of claim 10, wherein at least one of the plurality of ports of the switch element is configured to operate as an Ethernet port.

13. The device of claim 10, wherein at least one of the plurality of ports of the switch element is configured to operate as a Fibre Channel over Ethernet port.

14. The device of claim 9, wherein the device is an adapter.

15. The device of claim 9, wherein a data modification logic modifies the original data based on a data modifier.

16. A machine implemented method for a network device, comprising:
   receiving original data and corresponding original error correction code (ECC) by a receive segment of a port of the network device;
   providing a data modifier to a data modification logic indicating a modification type for modifying the received original data, where the data modifier indicates modifying a priority level for the received original data;
   modifying the original data based on the data modifier to create a modified data;
   comparing the modified data and the original data using an exclusive OR function for generating a pattern for modifying the original ECC;
   modifying the original ECC based on the pattern without having to regenerate the original ECC, wherein the pattern comprises syndrome bits derived from an output of the exclusive OR function; and
   transmitting the modified data and the modified ECC to a destination via a transmit segment of the network device.

17. The method of claim 16, wherein the network device is a switch element having a plurality of ports.

18. The method of claim 17, wherein at least one of the plurality of ports of the switch element is configured to operate as a Fibre Channel port or as an Ethernet port.

19. The method of claim 17, wherein at least one of the plurality of ports of the switch element is configured to operate as a Fibre Channel over Ethernet port.

20. The method of claim 16, wherein the device comprises an adapter.

* * * * *